United States Patent [19]

Amemiya et al.

[11] Patent Number: 5,400,386
[45] Date of Patent: Mar. 21, 1995

[54] ANGLE DETECTING DEVICE AND OPTICAL APPARATUS, SUCH AS EXPOSURE APPARATUS, EMPLOYING THE SAME

[75] Inventors: Mitsuaki Amemiya; Akira Miyake, both of Atsugi, Japan

[73] Assignee: Canon Kabushiki Kaisha, Tokyo, Japan

[21] Appl. No.: 277,352

[22] Filed: Jul. 19, 1994

Related U.S. Application Data

[63] Continuation of Ser. No. 103,151, Aug. 9, 1993, abandoned, which is a continuation of Ser. No. 738,524, Jul. 31, 1991, abandoned.

[30] Foreign Application Priority Data

Aug. 1, 1990 [JP] Japan .................... 2-202531

[51] Int. Cl.$^6$ .............................. A61B 6/08
[52] U.S. Cl. ................... 378/205; 378/145; 378/204; 356/138
[58] Field of Search ............ 378/34, 99, 204, 205, 378/206, 145; 356/138, 121, 399, 400, 401, 139.03

[56] References Cited

U.S. PATENT DOCUMENTS

| | | | |
|---|---|---|---|
| 3,497,695 | 2/1970 | Smith | 200/203.3 |
| 3,508,833 | 4/1970 | Waldhauer | 356/138 |
| 3,935,450 | 1/1976 | Spurgeon | 378/205 X |
| 4,018,532 | 4/1977 | Fletcher et al. | 200/203.14 |
| 4,636,080 | 1/1987 | Feldman | 356/401 |
| 4,675,892 | 6/1987 | Plessis et al. | 378/205 X |
| 4,869,591 | 9/1989 | MacGregor | 356/138 X |
| 5,056,129 | 10/1991 | Steinmeyer | 378/205 |
| 5,100,231 | 3/1992 | Sasnett et al. | 356/121 |
| 5,195,113 | 3/1993 | Kuwabara | 378/34 |
| 5,264,910 | 11/1993 | Hill | 356/141 |

FOREIGN PATENT DOCUMENTS

| | | |
|---|---|---|
| 0372278 | 11/1989 | European Pat. Off. . |
| 57-127821 | 10/1982 | Japan . |
| 61-125097 | 6/1986 | Japan . |
| 61-125097 | 6/1986 | Japan . |
| 62-092240 | 4/1987 | Japan . |
| 62-92240 | 4/1987 | Japan . |

*Primary Examiner*—David P. Porta
*Attorney, Agent, or Firm*—Fitzpatrick, Cella, Harper & Scinto

[57] ABSTRACT

Disclosed is a device for determining an angle of incident light or a shift in incident light based on the output value of a detector. In a predetermined angle detection range, a beam of light incident on a detector for detecting the intensity of light incident thereon is restricted such that the amount of light continuously increases or decreases in accordance with the angle between an optical axis of the incident light and a referential axis of an exposure apparatus. Outside of the predetermined angle detection range, the amount of light is restricted depending on the direction in which the optical axis of the light is shifted from the angle detection range. The amount of light incident on the detector continuously increases or decreases in accordance with the angle between the optical axis of the incident light and the referential axis when the light is made incident within the angle detection range by means of the light restriction means. It is therefore possible to determine the angle of the incident light from the output value of the detector. When the light is made incident outside of the angle detection range, and since the amount of incident light is restricted in accordance with the direction in which the light is shifted, it is possible to determine the direction in which the light is shifted.

36 Claims, 12 Drawing Sheets

FIG. 7
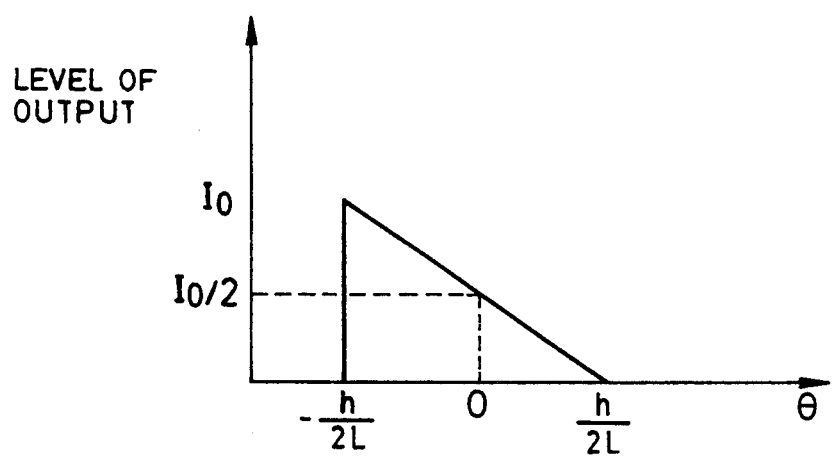
FIG. 8(a)    FIG. 8(b)
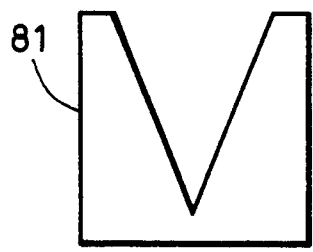
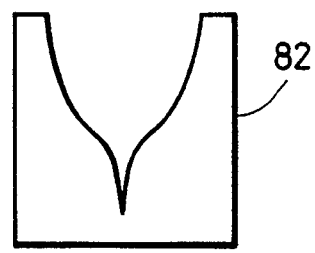

ANGLE DETECTING DEVICE AND OPTICAL APPARATUS, SUCH AS EXPOSURE APPARATUS, EMPLOYING THE SAME

This application is a continuation of prior application Ser. No. 08/103,151, filed Aug. 9, 1993, which application is a continuation of prior application Ser. No. 07/738,524, filed Jul. 31, 1991, both now abandoned.

BACKGROUND OF THE INVENTION

1. Field of the Invention

The present invention relates to an angle detecting device, and to an exposure apparatus which employs the same, e.g., an exposure apparatus in which alignment between a mask and a wafer is performed using positioning light.

2. Description of the Related Art

In exposure apparatuses which are employed in the production of semiconductor chips, a mask on which a geometric pattern is formed and which serves as an original plate and a wafer substrate to be exposed must be aligned with a very high degree of accuracy.

FIG. 18 is a schematic view of a conventional exposure apparatus. In FIG. 18, a mask pattern for semiconductor chips is formed on a mask 1501. A resist is applied on a wafer substrate 1502 which may be a silicon wafer. A movable table 1503 is movable with the wafer substrate 1502 held thereon. An alignment optical system 1504 detects a shift in the position between the mask 1501 and the geometric patterns etched on the wafer substrate 1502. The mask 1501, the alignment optical system 1504, the movable table 1503 and other components are mounted on a base 1505. An illumination beam 1506 used in the exposure process may be synchrotron radiation.

FIG. 19 is an enlarged view of the essential parts of the exposure apparatus of FIG. 18. When an X-ray source is used as the illumination source, a mask pattern 1601 formed on the mask 1501 may be made of an X-ray absorber, such as gold. A resist 1603 is applied on an existing pattern 1602 previously etched into the wafer substrate 1502. Exposure must be conducted when the pattern 1601 on the mask 1501 is accurately aligned with the existing pattern 1602 on the wafer substrate 1502. To achieve this, the wafer substrate 1502 is registered with the mask 1501 such that a shift $\delta_1$ between the mask pattern transfer position defined by the direction of the illumination beam 1506 and the existing pattern on the wafer is zero. Therefore, it is desirable that the referential optical axis for the measurements conducted by the alignment optical system 1504 coincide with the direction of the illumination beam 1506. Even if they do not coincide with each other, the shift determined by the direction of the illumination beam 1506 can be corrected in the following manner.

Assuming that $\Theta$ is the angle between a straight line 1605 which is the reference of the measurements conducted by the alignment optical system and a straight line 1604 indicating the direction of the illumination beam 1506 and that G is the distance (the proximity gap) between the wafer substrate 1502 and the mask 1501, a shift $\delta_2$ measured by the alignment optical system is corrected based on a differential $\delta$ given by $$\delta = \Theta \cdot G$$

so as to obtain the shift $\delta_1$ determined by the direction of the illumination.

$$\delta_1 + \delta_2 = \delta$$

However, in this case, the proximity gap G must be a known factor. If an error $\Delta g$ exists in the gap G, the following error $\epsilon$ cannot be corrected.

$$\epsilon = \Theta \cdot \Delta g$$

If $\Delta g = 2$ μm, $|\epsilon| < 0.002$ μm can be achieved only when $|\Theta| \leq 1$ mrad.

FIG. 20 shows a conventional mechanism for detecting whether the optical axis of the radiation used for exposure coincides with the referential axis of the exposure apparatus. In this mechanism, two pin-hole plates 1701 and 1702 each having a pin-hole of a diameter d at the central portion thereof are disposed at an interval of a predetermined distance L in such a manner that the pin-holes are aligned with the referential axis of the exposure apparatus. The light which passes through the pin-hole plates 1701 and 1702 is detected by a detector 1703 which detects the shift of the optical axis of the exposure radiation from its output value.

FIG. 21 is a graph showing the relation between the intensity of light detected by the detector 1703 and the angle $\Theta$ between the optical axis of the exposure radiation and the referential axis of the exposure apparatus. The detector 1703 detects the maximum light intensity when the optical axis of the exposure radiation coincides with the referential axis, and the angle $\Theta$ is thereby reduced to zero. When an angle $\Theta$ exists the detected intensity of the light decreases accordingly. The light intensity curve of the detector 1703 is symmetrical to the aforementioned maximum value thereof.

The aforementioned conventional angle detecting mechanism for the exposure apparatus detects the maximum value when there is no angle, but detects two values when there is an angle. It is therefore impossible to determine both the shift of the optical axis and the direction of the shift thereof using the output value of the detector alone. This makes adjustment of the positioning of the exposure apparatus difficult. When the angle of incidence is to be obtained from the output of the detector, the angle detection mechanism must be moved over the entire range of angles so as to obtain the angle corresponding to the maximum output value. This is a troublesome task. Furthermore, when it is desired to enhance the detection accuracy, the value d/L (where L is the distance between the pin-hole plates, and d is the diameter of the pin-hole) must be reduced. However, reduction of the ratio d/L narrows the range of detectable angles or makes alignment of the exposure radiation with the referential axis of the exposure apparatus difficult.

SUMMARY OF THE INVENTION

A primary object of the present invention is to provide a technique for easily detecting a shift in the angle and direction of the shift of the optical axis of a beam of light with respect to the referential axis, and a technique for correcting the shift in the angle on the basis of the detected shift in the angle.

To achieve the above-described objects, the present invention provides an angle detecting device for detecting an angle of an optical axis of a beam of light relative to a referential axis. The device includes a detector for detecting the intensity of beam of light, and a light restricting member for restricting the beam of light incident on the detector such that the intensity of the light beam increases or decreases in accordance with the angle between the optical axis of the beam of light and the referential axis.

To achieve the above-described objects, the present invention also provides a method of detecting an angle of an optical axis of a beam of light relative to a referential axis. The method includes the steps of restricting the beam of light incident on a detector by a light restricting means such that the intensity of the light beam increases or decreases in accordance with the angle of the optical axis of the beam light relative to the referential axis and detecting the angle of the optical axis of the light beam based on an output of the detector to detect the intensity of the light. The present invention also can include a step of adjusting the angular relationship between the optical axis of the beam of light and the referential axis such that the angle is reduced to zero.

Another object of the present invention is to provide an optical apparatus, such as an exposure apparatus, which uses the above-described techniques, and a semiconductor device manufactured by the manufacturing process which uses the aforementioned exposure apparatus.

To achieve the above object, the present invention provides an optical device provided with angle detection means. The device comprises light generation means for generating a beam of light, angle detection means for detecting an angle of an optical axis of the beam of light relative to a referential axis of the optical device, and correction means for performing correction in accordance with the detected angle. The angle detection means includes a detector for detecting the intensity of the beam of light incident thereon, and a light restricting member for restricting the beam of light incident on the detector such that the intensity of the light beam increases or decreases in accordance with the angle between the optical axis of the beam of light and the referential axis. The optical device also can include holding means for holding an original and a substrate. In which case, the light generation means generates one of a beam of light for aligning the original plate with a substrate and a beam of light for exposure of the substrate. Also, in which case, the detector can include a pin-hole plate having a hole at a substantially central portion thereof and a position detector disposed at a position at which the light, which has passed through the pin-hole plate, is made incident for detecting an incident position of the light which differs in accordance with the angle of the beam of light, the pin-hole plate and the position detector being disposed in that order with the pin-hole plate being located on the incident side of the beam of light.

To achieve the above objects, the present invention also provides an exposure method including an angle detection operation. The method includes the steps of generating one of a beam of light for aligning an original plate with a substrate and a beam of light for illuminating the substrate for exposure, detecting an angle of an optical axis of the beam of light relative to a referential plate, the angle being detected from an output of a detector which detects intensity of light incident on the detector which is obtained when the incident beam of light is restricted by a light restricting member such that the amount of light increases or decreases in accordance with the angle between the optical axis of the beam of light and the referential plane, adjusting the angle detected in the detecting step such that the detected angle is reduced to zero and illuminating the light for exposure of the substrate after the adjusting step to expose the substrate in a pattern of the original plate. The present invention also can be utilized in a method of manufacturing semiconductor devices by a manufacturing process, in which case the method also includes a step of preparing a substrate and an original plate on which an original pattern of the semiconductor device is formed. Then, the illuminating step includes illuminating the light for exposure of the substrate after the adjusting step to expose the substrate in a pattern of the original plate.

BRIEF DESCRIPTION OF THE DRAWINGS

FIG. 7 is a graph showing the relation between the angle of incidence $\Theta$ and the output value of a detector 63, obtained in the second embodiment of the present invention;

FIGS. 8(a) and 8(b) respectively show modifications of a wedge-shaped slit 62 shown in FIG. 6 which are wedge-shaped slits 81 and 82;

DETAILED DESCRIPTION OF THE PREFERRED EMBODIMENTS

Embodiments of the present invention will now be described in detail with reference to the accompanying drawings.

Figure 1:
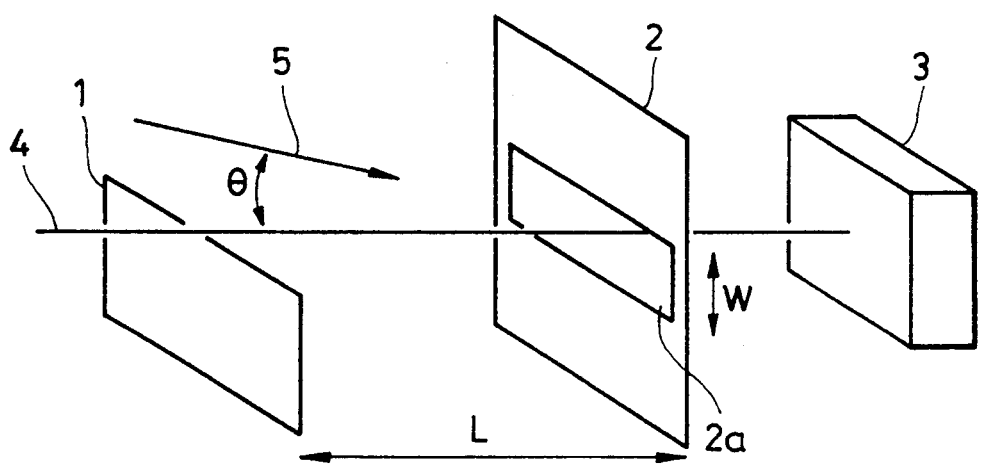
FIG. 1 shows the essential parts of a first embodiment of the present invention.

FIG. 1 shows the configuration of the essential parts of a first embodiment of the present invention.

Incident light limiting means includes a knife edge 1, and a slit 2 having a rectangular opening 2a substantially at the central portion thereof. The height of the opening 2a is W. Reference numeral 3 denotes a detector.

The knife edge 1 is provided such that the edge portion thereof is located on a referential axis 4 of an exposure apparatus. The slit 2 is disposed such that it is separated from the knife edge 1 by an interval L and such that the center of the opening 2a thereof is located on the referential axis 4. Hence, the intensity of the light of the detector 3 obtained when incident light 5 coincides with the referential axis 4 is one half of the intensity of the light $I_0$ obtained when no knife edge 1 is provided.

Figure 2:
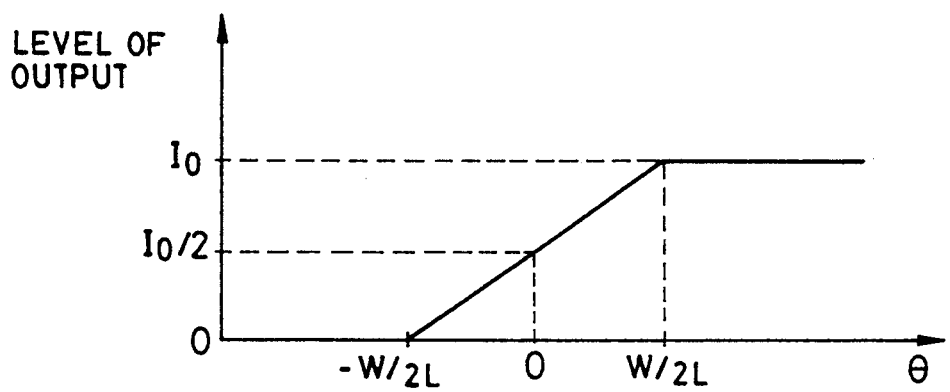
FIG. 2 is a graph showing the relation between the angle of incidence $\Theta$ and the output value of a detector 3, obtained in the first embodiment of the present invention.

FIG. 2 is a graph showing the relationship between the angle of incidence $\Theta$ between the referential axis 4 and the incident light 5 and the output value of the detector 3.

Assuming that the beam diameter of the incident light 5 is sufficiently larger than the height W of the opening 2a and that the upward deviation of the beam as viewed in FIG. 1 is positive, the output value of the detector 3 linearly increases from zero to $I_0$ when the angle of incidence $\Theta'$ is between $-W/2L$ and $W/2L$. When the angle of incidence $\Theta$ is $-W/2L$ or less, the output value of the detector 3 remains zero. At an angle of incidence $\Theta$ of $W/2L$ or above, the output value of the detector is $I_0$. Hence, when the angle of incidence $\Theta$ is between $\pm W/2L$ which is the angle detection range, the angle of incidence $\Theta$ can be obtained from the output value of the detector 3. Also, at an angle of incidence $\Theta$ which is outside of the angle detection range, it is possible to determine the direction in which the incident light deviates, i.e., whether the incident light deviates in a positive or negative direction.

The detection range of the above-described angle detection operation is $\pm 10$ mrad, when the height W is 1 mm and if the internal L is 100 mm. The detection accuracy is dependent on the precision of the detector 3. Consequently, an angle detection accuracy of $\pm 0.1$ mrad is obtained when the precision of the detector 3 is $\pm 1\%$.

In this embodiment, the knife edge 1 and the slit 2 are disposed in that order with the knife edge 1 being located closer to the light incident side. However, the knife edge 1 and the slit 2 may be exchanged in terms of the position.

In this embodiment, angle detection is performed only in one direction. However, two-dimensional reduction in the shift in the pattern transfer angle requires two-dimensional detection of the angle of incidence of the incident light. In this case, angle detection can be performed in two directions by providing two sets of mechanisms shown in FIG. 1 perpendicular to each other.

Figure 3:
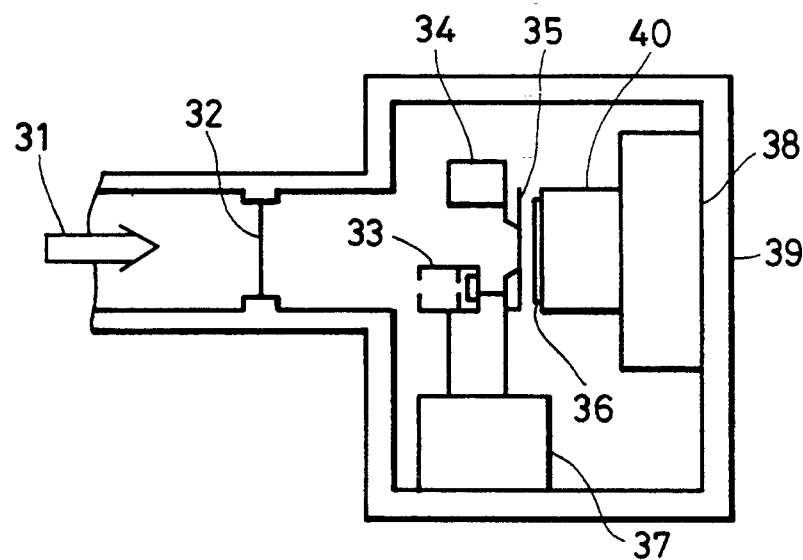
FIGS. 3 through 5 respectively show examples of exposure apparatuses which incorporate the first embodiment of the present invention.
Figure 4:
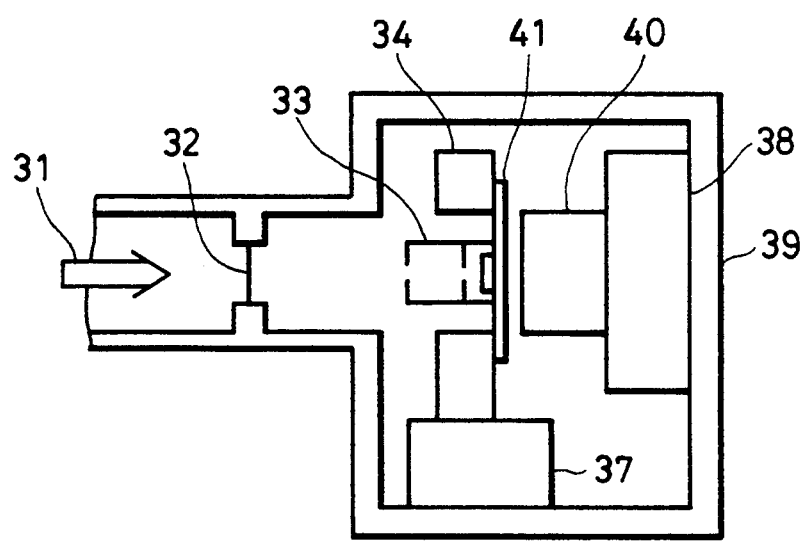
Figure 5:
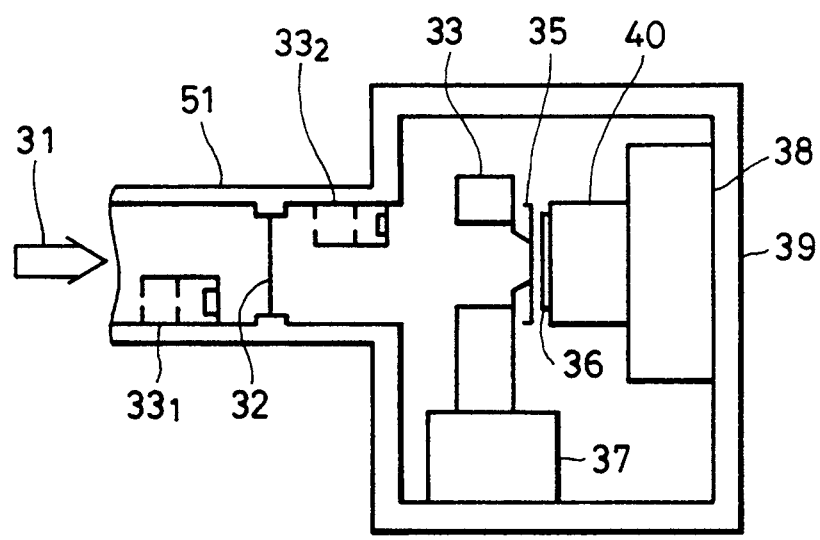

FIGS. 3 through 5 show an example of an X-ray exposure apparatus for performing exposure using synchrotron radiation into which the angle detection mechanism 33 shown in FIG. 1 is incorporated.

In either of the exposure apparatuses shown in FIGS. 3 through 5, exposure is conducted using synchrotron radiation 31 generated by a synchrotron radiation device. Since the operation associated with exposure is the same throughout the apparatus shown in FIGS. 1 through 3, it will be described below with the major components being indicated by the same reference numerals.

Synchrotron radiation 31 passes through an X-ray transmitting window 32 and is then made incident on an exposure chamber 39. In the synchrotron radiation 32 incident area in the exposure chamber 39, a mask 35 which is an original pattern and a wafer substrate 36 are respectively held by a mask chuck 34 and a wafer chuck 40. The mask and wafer chucks 34 and 40 are movably provided on mask and wafer stages 37 and 38, respectively.

In the exposure apparatus shown in FIG. 3, the angle detection mechanism 33 is provided on the outer peripheral portion of the mask chuck 34 parallel to the referential axis of the exposure chamber 39. Since exposure is conducted by the radiation which passes through the central portion of the mask 35, the configuration shown in FIG. 3 allows shifts in the angle and direction of the incident light, such as the synchrotron radiation 31, with respect to the referential axis to be detected during the exposure operation. The X-ray transmission window 32 shown in FIG. 3 is made larger than the typical ones in terms of area so as to allow the synchrotron radiation 31 to be illuminated on the angle detection mechanism 33.

In the exposure apparatus shown in FIG. 4, the angle detection mechanism 33 is fixed to a mounting plate 41. In this apparatus, angle detection is performed using the angle detection mechanism 33 chucked by the mask or wafer chuck 34 or 40 in place of the mask 35 or wafer 36 when the exposure chamber 39 is installed. FIG. 4 shows the state in which the angle detection mechanism 33 is chucked by the mask chuck 34. The angle detection mechanism 33 is removed when the exposure operation is conducted after detection of the angle. In this case, it is not necessary for the exposure chamber 39 to be provided with a special means (for example, an X-ray transmission window 32 having a normal size can be used).

In the exposure apparatus shown in FIG. 5, angle detection mechanisms 33₁ and 33₂ are provided in a beam line 51 for connecting the synchrotron radiation device to the exposure chamber parallel to the referential axis of the exposure chamber 39. The angle detection mechanism $33_1$ is provided between the X-ray transmission window 32 and the synchrotron radiation device, while the angle detection mechanism $33_2$ is disposed between the X-ray transmission window 32 and the exposure chamber 39. An angle detection operation requires only one of the angle detection mechanisms $33_1$ and $33_2$. In either case, it is possible to detect the angle of the synchrotron radiation 31 regardless of the state of the exposure apparatus. In a case wherein the angle detection mechanism is provided between the synchrotron radiation device and the X-ray transmission window 32, like the angle detection mechanism $32_1$, an X-ray transmission window 32 having a normal size can be used, as in the case shown in FIG. 4. It is not necessary for the angle detection mechanism to be provided parallel to the referential axis of the exposure apparatus. When the angle detection mechanism is provided at an angle with respect to the referential axis, the output value of the detector may be corrected in accordance with the angle.

Figure 6:
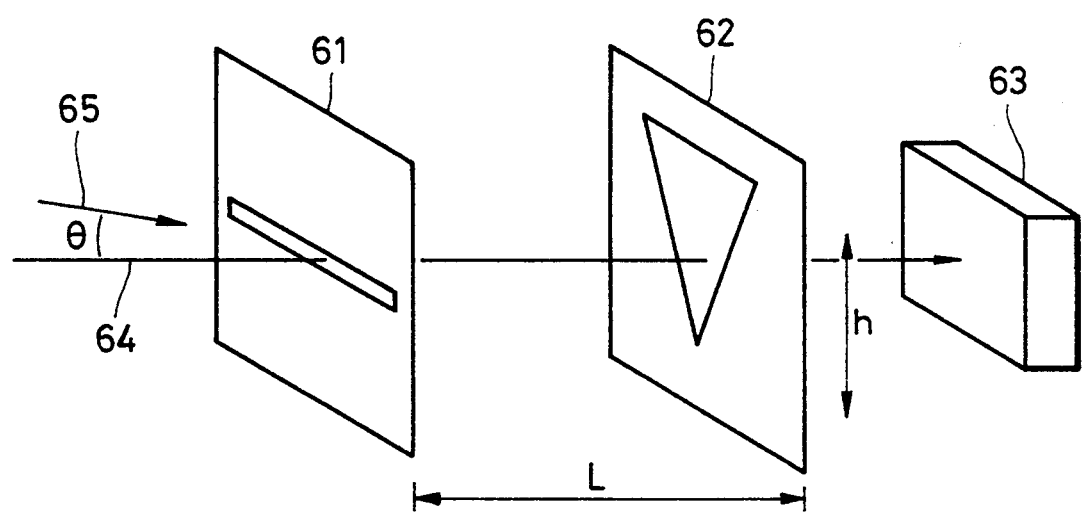
FIG. 6 shows the essential parts of a second embodiment of the present invention.

FIG. 6 shows the essential parts of a second embodiment of the present invention. In this example, an angle detection mechanism for detecting the angle of incident light 65 includes a slit 61, a wedge-shaped slit 62, the slits 61 and 62 constituting the incident light limiting means, and a detector 63. These components are disposed in that order along a referential axis 64 with the slit 61 located closest to the radiation source. The slit 61 has an elongated opening for limiting the amount of incident light 65 in the vertical direction, and the wedge-shaped slit 62 has an inverted triangular opening having a height of h which is the widest at the upper side thereof. The inverted triangular opening is provided to obtain the output value of the detector 63 corresponding to the angle of incidence $\Theta$ of the incident light 65. The slit 61 and the wedge-shaped slit 62 are disposed apart from each other by an interval L in such a manner that the referential axis 64 passes the center of the individual openings.

FIG. 7 is a graph showing the relationship between the angle of incidence $\Theta$ of the incident light 65 and the output value of the detector 63.

When the angle of incidence $\Theta$ is between $-h/2L$ and $h/2L$ which is the angle detection range, the output value of the detector 63 linearly decreases from $I_0$ to 0. When the angle of incidence $\Theta$ is $-h/2L$ or less, the output value of the detector 63 is $I_o$. At an angle of incidence of $h/2L$ or above, the output value of the detector 63 is zero. Hence, it is possible to determine the angle of incidence $\Theta$ from the output value of the detector 63, as in the case of the aforementioned first embodiment.

In the embodiment shown in FIG. 6, the wedge-shaped slit 62 has an inverted triangular opening. The output characteristics of the detector 63 with respect to the angle of incidence $\Theta$ can be changed by changing the shape of this opening.

In the embodiment shown in FIG. 6, the slit 61 and the wedge-shaped slit 62 are disposed in that order with the slit 61 located closest to the light incident side. The order at which these slits are disposed may be changed. This also applies to modifications of the second embodiment which will be described below with reference to FIGS. 8(a) and 8(b).

Figure 9A:
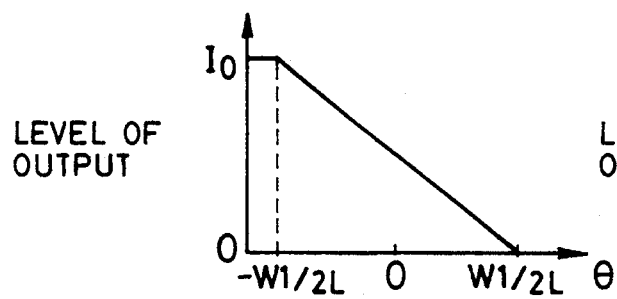
FIGS. 9(a) and 9(b) are graphs showing the relations between the angle of incidence $\Theta$ and the output value of the detector 63, respectively obtained when the wedge-shaped slits 81 and 82 of FIGS. 8(a) and 8(b) are used.
Figure 9B:
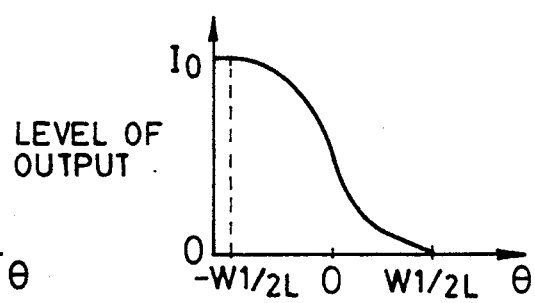

FIG. 8(a) shows a wedge-shaped slit 81 having a V-shaped notch, and FIG. 8(b) shows a wedge-shaped slit 82 having a V-shaped notch whose sides are curved. FIGS. 9(a) and 9(b) are graphs respectively showing the output characteristics of the detector 63 with respect to the angle of incidence $\Theta$ obtained when the wedge-shaped slits 81 and 82 shown in FIGS. 8(a) and 8(b) are used in place of the wedge-shaped slit 62 shown in FIG. 6.

Assuming that the height of the notch of the wedge-shaped slits 81 and 82 is W1, in the case of using the wedge-shaped slit 81, when the angle of incidence $\Theta$ is between $-W1/2L$ and $W1/2L$, the output value of the detector 63 linearly decreases from $I_o$ to zero, as shown in FIG. 9(a). In the case of the wedge-shaped slit 82, when the angle of incidence $\Theta$ is between $-W1/2L$ and $W1/2L$, the output value of the detector 63 continuously decreases from $I_o$ to zero. However, the degree of that decrease differs depending on the range of the angle of incidence, as shown in FIG. 9(b), because of a non-linear change in the lateral length of the notch caused by the curved sides of the notch of the wedge-shaped slit 82. In the angle detection conducted using the wedge-shaped slit 82, the output value of the detector obtained when the angle between the incident light 65 and the referential axis 64 is in the vicinity of zero changes rapidly, and the angle detection accuracy is thus improved.

Figure 10:
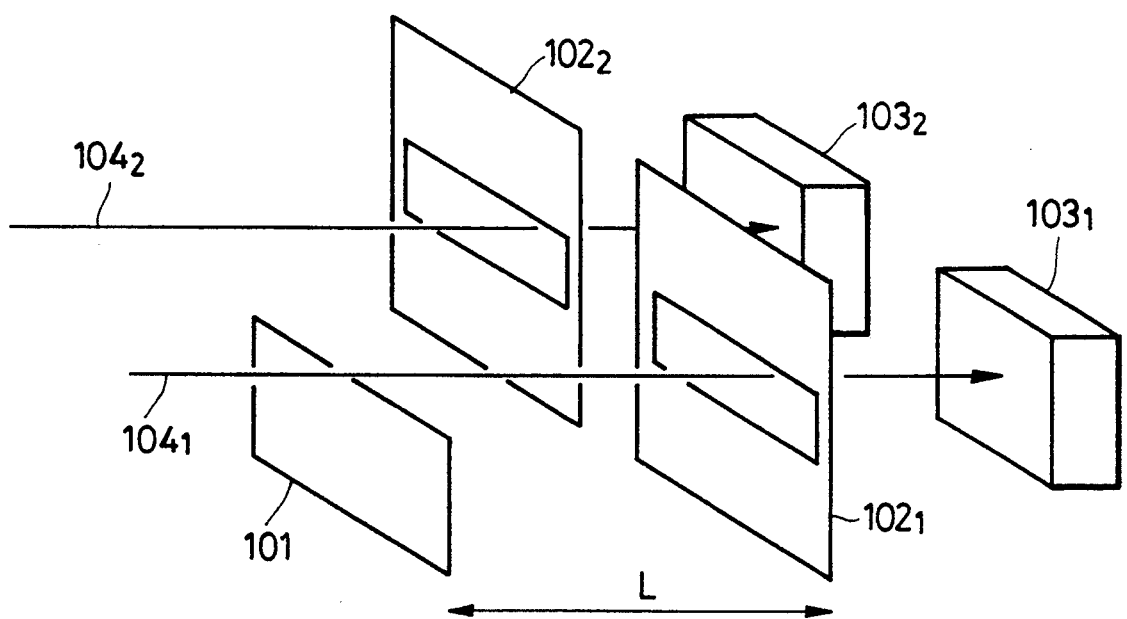
FIG. 10 shows the essential parts of a third embodiment of the present invention.

FIG. 10 shows the essential parts of a third embodiment of the present invention.

The embodiments shown in FIGS. 1 through 6 are designed to detect the angle of the optical axis of radiation from the output value of the detector. Therefore, in these methods, variations in the intensity of incident light generate detection errors. This may cause a problem in the X-ray exposure apparatuses of the type which use synchrotron radiation as the exposure radiation, shown in FIGS. 3 through 5, because variations in the intensity of incident light readily occur in such apparatuses.

This third embodiment is directed to detection of the angle from the rate of the detected value of the detector to a monitored intensity of incident light.

In FIG. 10, a knife edge 101, a slit $102_1$, a detector $103_1$ and a referential axis $104_1$ have the same configurations as the knife edge 1, the slit 2, the detector 3 and the referential axis 4 shown in FIG. 1, and are disposed in the same manner as those components. In addition to these components, the third embodiment further includes a slit $102_2$ and a detector $103_2$ which form a second detector and which are respectively similar to the slit $102_1$ and the detector $103_1$. The slit $102_2$ and the detector $103_2$ are disposed such that a referential axis $104_2$ which is parallel to the referential axis $104_1$ passes through the center of the opening of the slit $102_2$.

The detector $103_1$ detects the angle in the same manner as that shown in FIG. 1. The detector $103_2$ detects the intensity of incident light (not shown) independently of the detection of the angle of incidence $\Theta$ thereof.

In this embodiment, the angle is detected from the value obtained by dividing the output of the detector $103_1$ by the output of the detector $103_2$ (hereinafter referred to as a shifting value).

Figure 11:
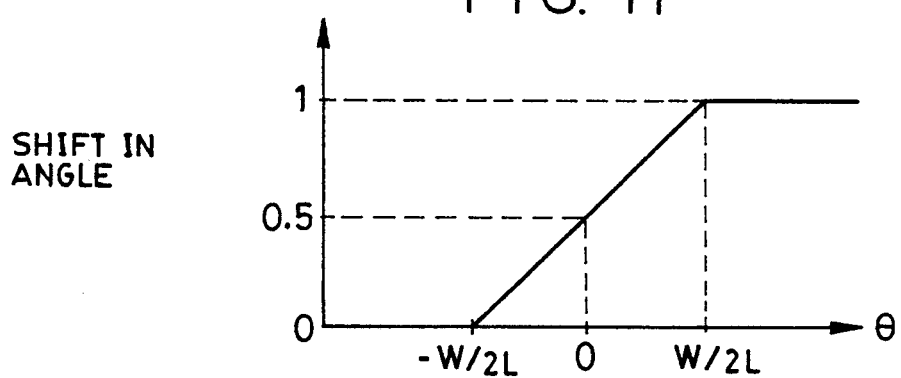
FIG. 11 is a graph showing the relation between the angle of incidence $\Theta$ and a shifting value, obtained in the third embodiment of the present invention.

FIG. 11 is a graph showing the relation between the shifting value and the angle of incidence $\Theta$.

In the third embodiment, angle detection accuracy remains the same even when the intensity of incident light varies. This allows a highly accurate angle detection to be conducted all the time.

In the third embodiment, a detector is used to detect the intensity of incident light. However, the intensity of incident light may indirectly be detected (by monitoring the acceleration voltage or current in the case of X-rays generated from a ring gun).

Figure 12:
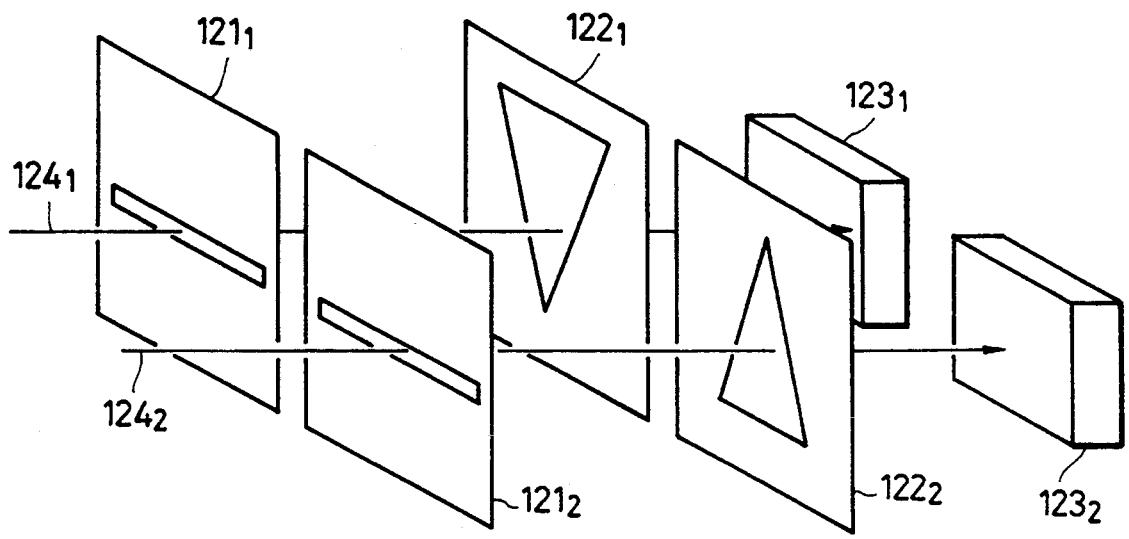
FIG. 12 shows the essential parts of a fourth embodiment of the present invention.

FIG. 12 shows the essential parts of a fourth embodiment of the present invention.

This embodiment is designed to eliminate angle detection errors caused by variations in the intensity of incident light by using a combination of two detectors whose dependencies of the output values on the angle of incidence differ from each other in a complementary fashion, unlike the third embodiment in which the angle detection errors are eliminated by monitoring the intensity of incident light.

The angle detection mechanism according to this embodiment includes a slit $121_1$, a wedge-shaped slit $122_1$, a detector $123_1$, the slit $121_1$, the wedge-shaped slit $122_1$ and the detector $123_1$ being disposed in that order with respect to a referential axis $124_1$, and a slit $121_2$, a wedge-shaped slit $122_2$ and a detector $123_2$, the slit $121_2$, the wedge-shaped slit $122_2$ and the detector $123_2$ being disposed in that order with respect to a referential axis $124_2$ which is parallel to the referential axis $124_1$. The slits $121_1$ and $121_2$ and the corresponding wedge-shaped slits $122_1$ and $122_2$ are respectively separated by a distance L, as in the case of the second embodiment shown in FIG. 6. The wedge-shaped slit $122_1$ has an inverted triangular opening which has a height of h and which is widest at the upper side. The wedge-shaped slit $122_2$ has a triangular opening which has a height of h which is the widest at the lower side thereof. Since the individual openings are formed in the wedge-shaped slits $122_1$ and $122_2$ such that the sum of the lateral lengths thereof are constant at positions in the vertical direction, the sum of the intensities of incident light (not shown) detected by the detectors $123_1$ and $123_2$ is also constant regardless of the angle of incidence $\Theta$.

Figure 13:
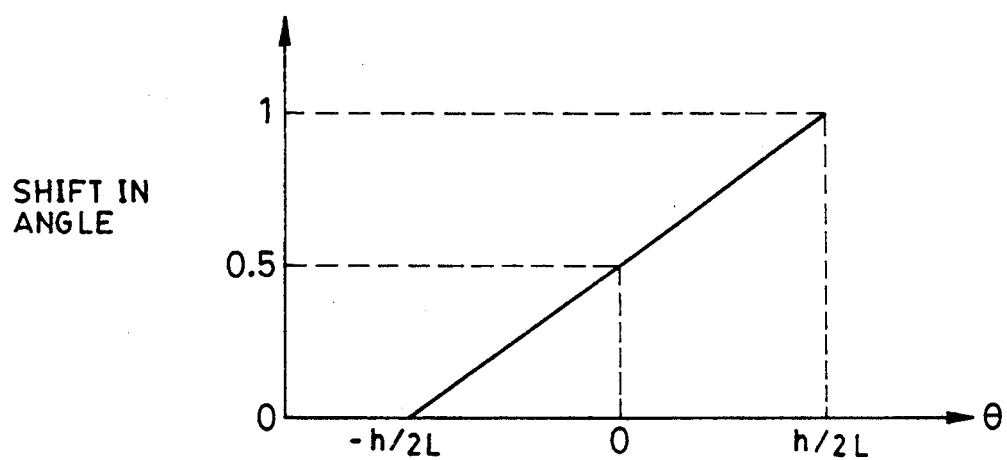
FIG. 13 is a graph showing the relation between the angle of incidence $\Theta$ and a shifting value, obtained in the fourth embodiment of the present invention.

In this embodiment, angle detection is performed using the shifting value obtained by dividing the intensity of light detected by the detector $123_2$ (or by the detector $123_1$) by the sum of the intensities of light detected by the detectors $123_1$ and $123_2$. FIG. 13 is a graph showing the relationship between the shifting value and the angle of incidence $\Theta$.

In this embodiment, a highly accurate angle detection can be performed independently of variations in the intensity of incident light.

In this embodiment, the slits $121_1$ and $121_2$ and the wedge-shaped slits $122_1$ and $122_2$ are disposed in that order with the slits $121_1$ and $121_2$ being disposed on the light incident side. However, the wedge-shaped slits $122_1$ and $122_2$ and the slits $121_1$ and $121_2$ may be disposed in that order.

In the aforementioned embodiments, a photodiode or a photomultiplier can be used as a detector for detecting visible or ultraviolet radiation, and a proportional counter, a semiconductor detector, a photomultiplier or a microchannel plate may be used as a detector for detecting X-rays. These allow angle determination to be conducted in various types of exposure apparatuses.

Figure 14:
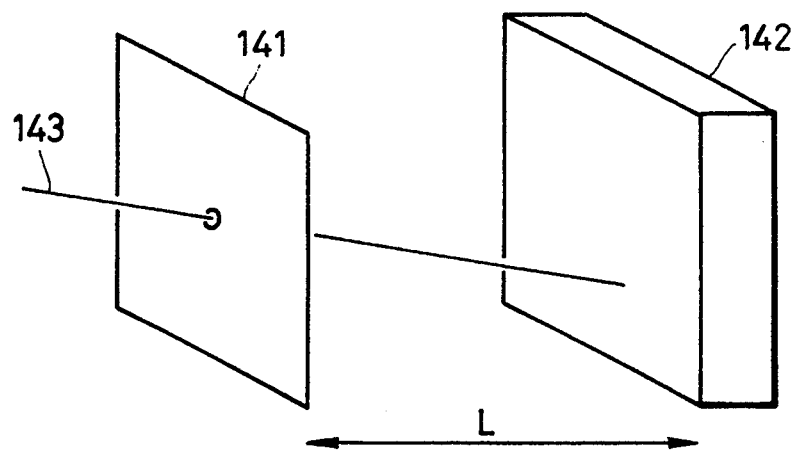
FIG. 14 shows the essential parts of a fifth embodiment of the present invention.

FIG. 14 shows the essential parts of a fifth embodiment of the present invention.

In this embodiment, angle detection is performed by an angle detection mechanism which is made up of a pin-hole plate 141 having a small opening at the central portion thereof and a two-dimensional position detector 142. The pin-hole plate 141 and the two-dimensional position detector 142 are disposed in that order in the direction of propagation of incident light 143.

The pin-hole plate 141 and the two-dimensional position detector 142 are disposed at an interval parallel to a referential axis (not shown) of the exposure apparatus. At that time, if both the diameter of the small hole formed in the pin-hole plate 141 and the angle resolution of the detector 142 are 10 $\mu$m, and if the interval L is 100 mm, it is possible to detect the angle of incidence associated with the two directions of the incident light 143 with an accuracy of 0.1 mrad.

In this embodiment, since the angle detection can be conducted using the two components, the size of the angle detection mechanism can be reduced and the structure thereof can be simplified. Furthermore, a CCD, a position sensitive detector or a multianode proportional counter may be used as the position detector.

Figure 15:
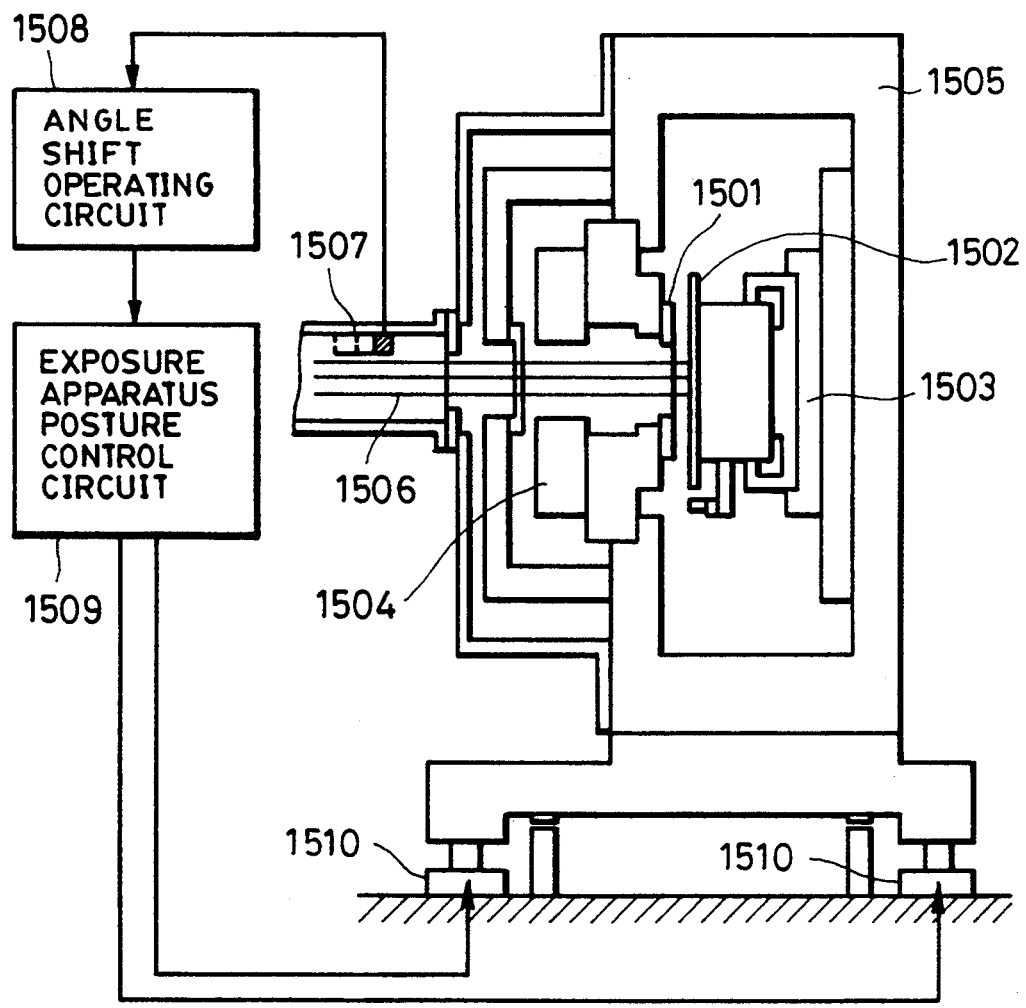
FIG. 15 shows an exposure apparatus according to the present invention.
Figure 18:
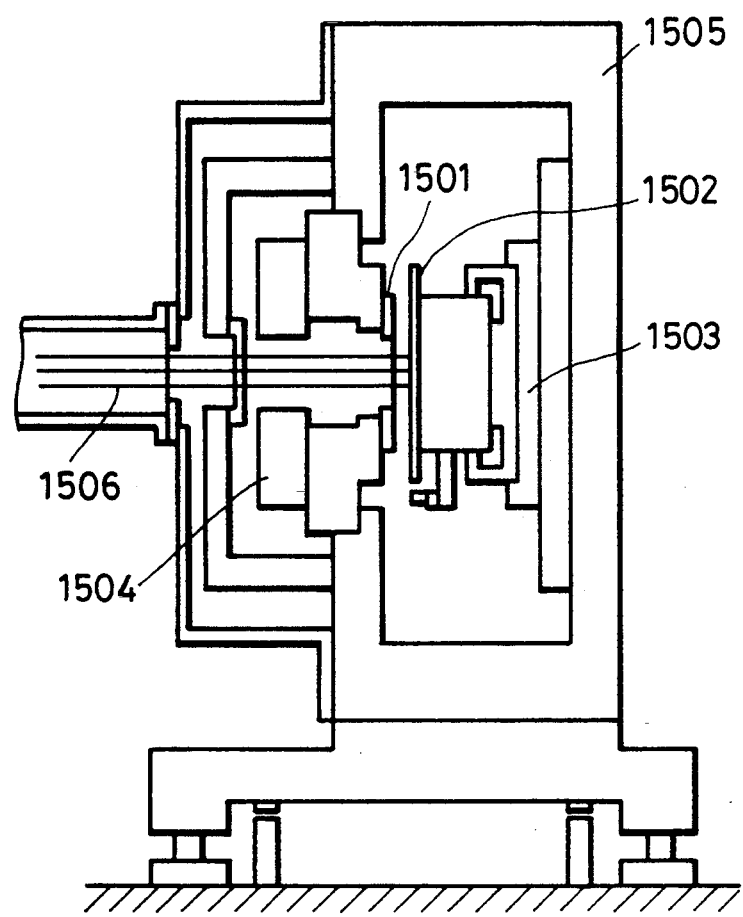
FIG. 18 schematically shows a conventional exposure apparatus.
Figure 19:
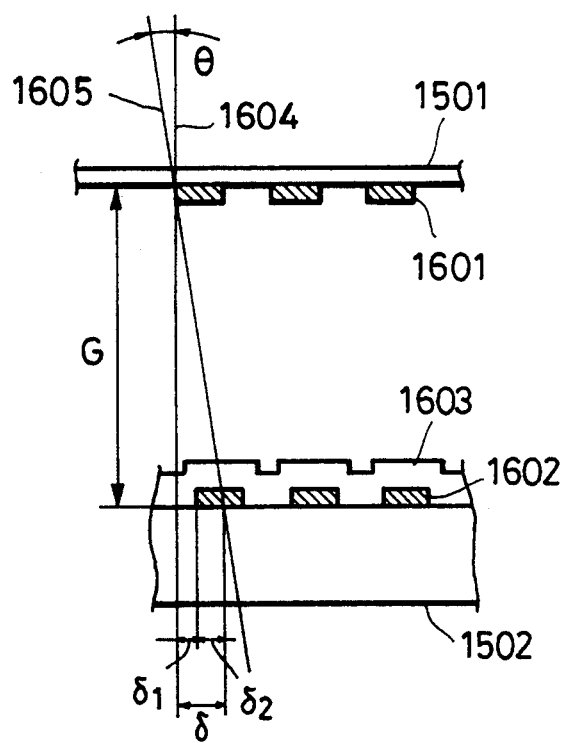
FIG. 19 illustrates the principle of a conventional angle detection.
Figure 20:
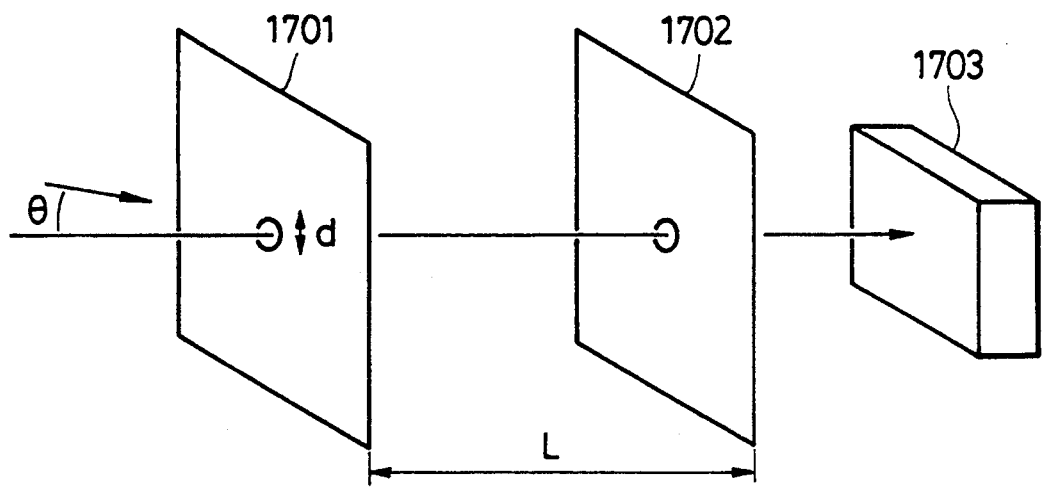
FIG. 20 shows a conventional angle detection mechanism.
Figure 21:
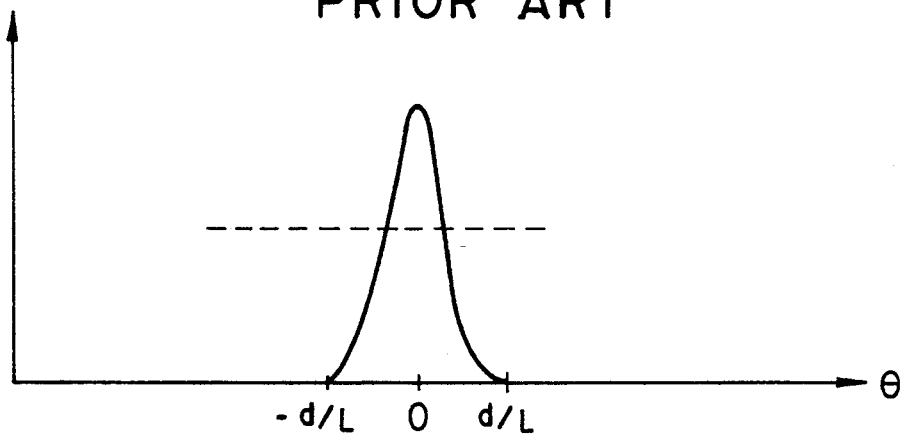
FIG. 21 is a graph showing the relation between the angle of incidence $\Theta$ and the output value of a detector 1703, obtained in the conventional technique.

FIG. 15 shows an exposure apparatus which incorporates any of the aforementioned angle detectors. The exposure apparatus is used in the lithographic process during the manufacture of semiconductor devices (semiconductor IC or LSI chips, liquid crystal panels or CCDs). The same reference numerals are used to denote components which are the same as those of FIG. 18. The angle detector 1507 has the configuration as that shown in any of the aforementioned embodiments. The angle detector may also be disposed at a position shown in any of FIGS. 3, 4 and 5. An angle operating circuit 1508 operates a shift using the output of the angle detector 1507. An exposure apparatus posture control circuit 1509 drives a posture control actuator 1510 in accordance with the shift to cancel the shift. Since the angle detection method according to the present invention is capable of detecting the amount and direction of shift, control is facilitated. The shift may be cancelled by moving an illumination optical system while fixing the exposure apparatus. Alternatively, a shift in the position of the transferred pattern may be calculated from the shift in the angle of the optical axis, and the wafer substrate 1502 may be moved such that the shift in the position of the transferred pattern can be cancelled so as to align the mask 1501 and wafer substrate 1502 with the illumination beam 1506. In either case, a shift of the mask 1501 and wafer 1502 relative to the illumination beam 1506 can be cancelled on the basis of the output of angle detector 1507.

Figure 16:
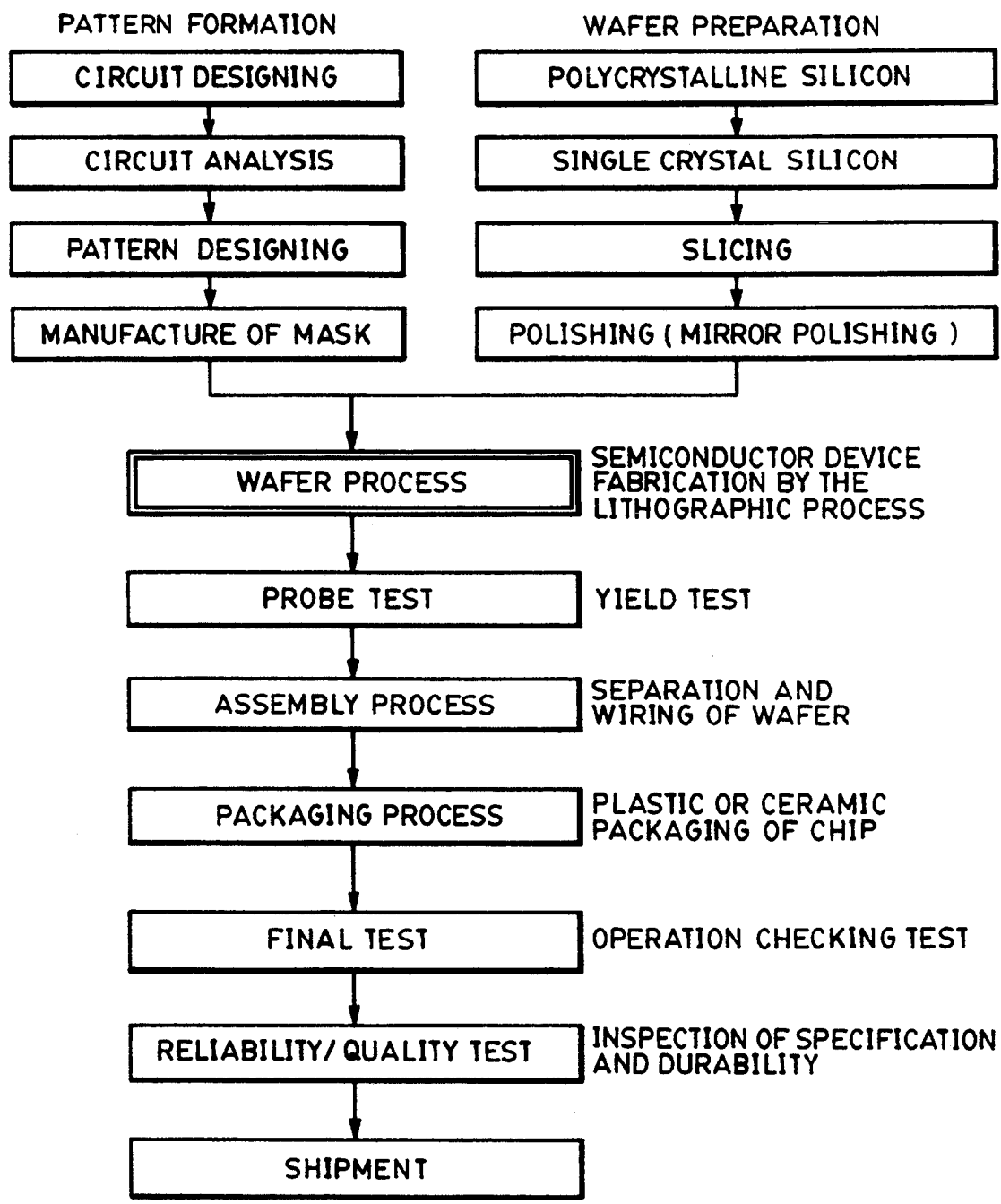
FIG. 16 shows the steps in the manufacturing processes of semiconductor chips.
Figure 17:
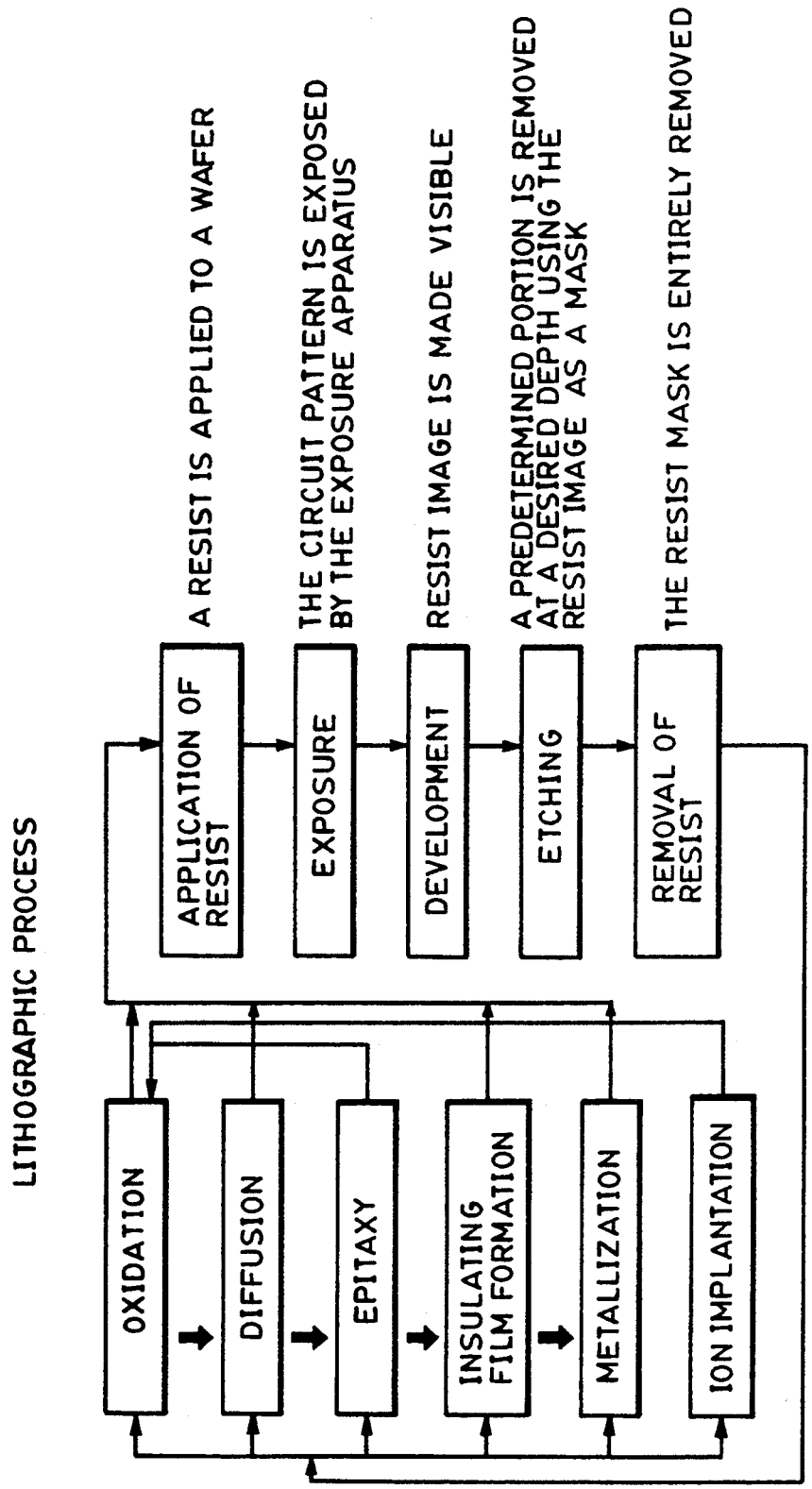
FIG. 17 shows the flow of the lithographic process in the manufacturing process of the semiconductor chips.

FIGS. 16 and 17 illustrate semiconductor chip manufacturing processes utilizing the exposure process which uses the aforementioned exposure apparatus. FIG. 16 shows the steps in major semiconductor chip manufacturing processes, and FIG. 17 shows the steps in a lithographic process conducted in the wafer process shown in FIG. 16. In the wafer process in which ICs are fabricated on a silicon wafer, the processes shown in FIG. 17 are conducted repetitively (for example, twenty times). The use of the exposure apparatus according to the present invention improves the exposure accuracy, such as the transfer position accuracy, and thereby enables highly integrated semiconductor chips to be manufactured.

The angle detection technique and the exposure apparatus which uses this technique have been described. However, the angle detection technique according to the present invention can also be utilized in an alignment method conducted in various types of optical apparatuses, such as microscopes, X-ray diffraction meters or telescopes.

While the present invention has been described with respect to what is presently considered to be the preferred embodiments, it is to be understood that the invention is not limited to the disclosed embodiments. To the contrary, the invention is intended to cover various modifications and equivalent arrangements included within the spirit and scope of the appended claims. The scope of the following claims is to be accorded the broadest interpretation so as to encompass all such modifications and equivalent structures and function.

What is claimed is:

1. An angle detecting device for detecting a magnitude and direction of an angle of an optical axis of an X-ray beam relative to a referential axis, said device comprising:

first and second X-ray restricting members, disposed along the referential axis, for restricting the X-ray beam such that the intensity of the X-ray beam increases or decreases in accordance with the magnitude and direction of the angle between the optical axis of the X-ray beam and the referential axis; and a detector for receiving the X-ray beam restricted by said restricting members, and for detecting the magnitude and the direction of the angle between the optical axis and the referential axis in accordance with the intensity of the X-ray beam, wherein said second X-ray restricting member comprises a wedge-shaped slit having an opening whose dimension increases or decreases along a predetermined direction.

2. The angle detecting device according to claim 1, wherein said first X-ray restricting member comprises a slit having an opening for restricting the X-ray beam in said predetermined direction.

3. The angle detecting device according to claim 1, further comprising correction means for providing angle detection without being affected by variations in the intensity of the X-ray light beam.

4. The angle detecting device according to claim 3, wherein said correction means comprises means for detecting variations in the intensity of the X- ray light beam.

5. The angle detecting device according to claim 1, further comprising a synchrotron radiation source for emitting the X-ray beam.

6. The angle detecting device according to claim 1, further comprising an exposure apparatus in which said angle detecting device is used.

7. A method of correcting a magnitude and direction of an angle of an optical axis of an X-ray beam relative to a referential axis, said method comprising the steps of:
restricting the X-ray beam incident on a detector by first and second X-ray restricting members disposed on the referential axis, such that the intensity of the X-ray beam increases or decreases in accordance with the magnitude and direction of the angle between the optical axis of the X-ray beam and the referential axis;
detecting the magnitude and direction of the angle of the optical axis of the X-ray beam from an output of the detector corresponding to the intensity of the X-ray beam; and
adjusting the angular relationship between the optical axis of the X-ray beam and the referential axis such that the angle is reduced to zero,
wherein said second X-ray restricting member comprises a wedge-shaped slit having an opening whose dimension increases or decreases along a predetermined direction.

8. The angle correcting method according to claim 7, further comprising performing a correction required for angle detection without being affected by variations in the intensity of the light beam.

9. The angle detecting device according to claim 7, wherein said first X-ray restricting member comprises a slit having an opening for restricting the X-ray beam in said predetermined direction.

10. A method of detecting a magnitude and direction of an angle of an optical axis of an X-ray beam relative to a referential axis, said method comprising the steps of:
restricting the X-ray beam incident on a detector by first and second X-ray restricting members disposed along the referential axis, such that the intensity of the X-ray beam increases or decreases in accordance with the magnitude and direction of the angle of the optical axis of the X-ray beam relative to the referential axis; and
detecting the magnitude and direction of the angle of the optical axis of the X-ray beam based on an output of the detector corresponding to the intensity of the X-ray beam,
wherein said second X-ray restricting member comprises a wedge-shaped slit having an opening whose dimension increases or decreases along a predetermined direction.

11. The angle detecting method according to claim 10, wherein said detecting step comprises detecting a direction of the angle from the output of the detector when the magnitude of the angle is outside of an angle detection range.

12. The angle detecting method according to claim 10, further comprising performing a correction in order to conduct angle detection without being affected by variations in the intensity of the X-ray beam.

13. The angle detecting device according to claim 10, wherein said first X-ray restricting member comprises a slit having an opening for restricting the X-ray beam in said predetermined direction.

14. An optical device including angle detection means, said device comprising:
X-ray generation means for generating an X-ray beam;
angle detection means comprising (i) a detector for detecting a magnitude and direction of an angle of an optical axis of the X-ray beam relative to a referential axis of said optical device in accordance with the intensity of the X-ray beam incident thereon, and for producing a detection output and (ii) first and second restricting members disposed along the referential axis for restricting the X-ray beam incident on said detector such that the intensity of the X-ray beam increases or decreases in accordance with the magnitude and direction of the angle between the optical axis of the X-ray beam and the referential axis; and
correction means for receiving the detection output and for correcting the angle of the optical axis of the X-ray beam in accordance with the detected magnitude and direction of the angle,
wherein said second X-ray restricting member comprises a wedge-shaped slit having an opening whose dimension increases or decreases along a predetermined direction.

15. The optical device according to claim 14, wherein said correction means is required for angle detection without being affected by variations in the intensity of the X-ray beam.

16. The angle detecting device according to claim 14, wherein said first X-ray restricting member comprises a slit having an opening for restricting the X-ray beam in said predetermined direction.

17. A semiconductor device manufactured by a manufacturing process, said process comprising the steps of:
providing a substrate and an original on which a pattern for the semiconductor device is formed;
generating an X-ray beam for illuminating the substrate for exposure;
detecting the magnitude and direction of an angle of an optical axis of the X-ray beam relative to a referential axis from an output of a detector which detects an intensity of an incident X-ray beam which is obtained when the incident X-ray beam is restricted by first and second restricting members such that the intensity of the X-ray beam increases or decreases in accordance with the magnitude and direction of the angle between the optical axis of the X-ray beam and the referential axis; and illuminating the X-ray beam for exposing the substrate to transfer a pattern of the original onto the substrate, wherein said second X-ray restricting member comprises a wedge-shaped slit having an opening whose dimension increases or decreases along a predetermined direction.

18. The angle detecting device according to claim 17, wherein said first X-ray restricting member comprises a slit having an opening for restricting the X-ray beam in said predetermined direction.

19. An exposure apparatus including angle detection means, said apparatus comprising:

holding means for holding an original and a substrate;

X-ray generation means for generating an X-ray beam for exposing the substrate; and angle detection means for detecting a magnitude and direction of an angle of an optical axis of the X-ray beam relative to a referential axis of the exposure apparatus, said angle detection means comprising a detector for detecting the intensity of the X-ray beam incident thereon, and first and second restricting members for restricting the X-ray beam incident on said detector such that the intensity of the X-ray beam increases or decreases in accordance with the magnitude and direction of the angle between the optical axis of the X-ray beam and the referential axis, wherein said second X-ray restricting member comprises a wedge-shaped slit having an opening whose dimension increases or decreases along a predetermined direction.

20. The exposure apparatus according to claim 19, further comprising correction means required for angle detection without being affected by variations in the intensity of the X-ray beam.

21. The exposure apparatus according to claim 19, further comprising adjustment means for adjusting the angular relation between the X-ray light beam and the referential axis.

22. The exposure apparatus according to claim 21, further comprising means for controlling said adjustment means on the basis of the output of said angle detection means.

23. The exposure apparatus according to claim 21, wherein said adjustment means comprises a mechanism for adjusting the relation between said X-ray generation means and said holding means.

24. The exposure apparatus according to claim 19, wherein said X-ray generation means comprises a synchrotron radiation source.

25. The angle detecting device according to claim 19, wherein said first X-ray restricting member comprises a slit having an opening for restricting the X-ray beam in said predetermined direction.

26. The exposure apparatus according to claim 19, wherein said substrate comprises a semiconductor wafer to which an original pattern of a semiconductor chip is illuminated for exposure.

27. A method of manufacturing semiconductor devices by a manufacturing process, said method comprising the steps of:

providing a substrate and an original on which a pattern for the semiconductor device is formed;

generating an X-ray beam for illuminating the substrate for exposure;

detecting the magnitude and direction of an angle of an optical axis of the X-ray beam relative to a referential axis from an output of a detector which detects an intensity of an incident X-ray beam which is obtained when the incident X-ray beam is restricted by first and second restricting members such that the intensity of the X-ray beam increases or decreases in accordance with the magnitude and direction of the angle between the optical axis of the X-ray beam and the referential axis; and illuminating the X-ray beam for exposing the substrate to transfer a pattern of the original onto the substrate, wherein said second X-ray restricting member comprises a wedge-shaped slit having an opening whose dimension increases or decreases along a predetermined direction.

28. The method of manufacturing semiconductor devices according to claim 27, wherein said illuminating step comprises illuminating a silicon wafer for exposure thereof.

29. The angle detecting device according to claim 27, wherein said first X-ray restricting member comprises a slit having an opening for restricting the X-ray beam in said predetermined direction.

30. An exposure method including an angle detection operation, said method comprising the steps of:

generating an X-ray beam for illuminating a substrate for exposure;

detecting the magnitude and direction of an angle of an optical axis of the X-ray beam relative to a referential axis from an output of a detector which detects an intensity of incident light which is obtained when the X-ray beam is restricted by first and second restricting members such that the intensity of the X-ray beam increases or decreases in accordance with the magnitude and direction of the angle between the optical axis of the X-ray beam and the referential axis; and illuminating the X-ray beam for exposing the substrate to transfer a pattern of the original onto the substrate, wherein said second X-ray restricting member comprises a wedge-shaped slit having an opening whose dimension increases or decreases along a predetermined direction.

31. The exposure method according to claim 30, wherein said illuminating step comprises exposing a semiconductor wafer to a pattern of semiconductor chips.

32. The angle detecting device according to claim 30, wherein said first X-ray restricting member comprises a slit having an opening for restricting the X-ray beam in said predetermined direction.

33. An angle detecting device for detecting a magnitude and direction of an angle of a beam axis of a radiation beam relative to a referential axis, said device comprising:

first and second restricting members, disposed along the referential axis, for restricting the radiation beam such that the intensity of the radiation beam increases or decreases in accordance with the magnitude and direction of the angle between the beam axis of the radiation beam and the referential axis; and a detector for receiving the radiation beam restricted by said restricting members, and for detecting the magnitude and the direction of the angle between the beam axis and the referential axis in accordance with the intensity of the radiation beam, wherein said second restricting member comprises a wedge-shaped slit having an opening whose dimension increases or decreases along a predetermined direction.

34. The angle detecting device according to claim 33, wherein said first restricting member comprises a slit having an opening for restricting the radiation beam in the predetermined direction.

35. An exposure method including an angle detection operation, said method comprising the steps of:

generating a radiation beam for illuminating a substrate for exposure;

detecting the magnitude and direction of an angle of a beam axis of the radiation beam relative to a referential axis from an output of a detector which detects an intensity of an incident beam which is obtained when the radiation beam is restricted by first and second restricting members such that the intensity of the radiation beam increases or decreases in accordance with the magnitude and direction of the angle between the beam axis of the radiation beam and the referential axis; and illuminating the radiation beam for exposing the substrate to transfer a pattern of the original onto the substrate, wherein said second restricting member comprises a wedge-shaped slit having an opening whose dimension increases or decreases along a predetermined direction.

36. The exposure method according to claim 35, wherein said illuminating step comprises exposing a semiconductor wafer to a pattern of semiconductor chips.

* * * * *

UNITED STATES PATENT AND TRADEMARK OFFICE
CERTIFICATE OF CORRECTION

PATENT NO. : 5,400,386
DATED : March 21, 1995
INVENTOR(S) : Mitsuaki AMEMIYA, et al.

It is certified that error appears in the above-indentified patent and that said Letters Patent is hereby corrected as shown below:

ON THE COVER PAGE:

UNDER "FOREIGN PATENT DOCUMENTS":

"62-92240 4/1987 Japan" should be deleted.

COLUMN 5:

Line 24, "$\theta'$" should read --$\theta$--.

COLUMN 8:

Line 24, "1041" should read --$104_1$--.

COLUMN 10:

Line 51, "function." should read --functions.--.

COLUMN 11:

Line 12, "light" should be deleted;
Line 15, "light" should be deleted; and
Line 21, "comprising-an" should read --comprising an--.

UNITED STATES PATENT AND TRADEMARK OFFICE
CERTIFICATE OF CORRECTION

PATENT NO. : 5,400,386
DATED : March 21, 1995
INVENTOR(S) : Mitsuaki AMEMIYA, et al.

It is certified that error appears in the above-indentified patent and that said Letters Patent is hereby corrected as shown below:

<u>COLUMN 13</u>:

Line 39,- "light" should be deleted.

Signed and Sealed this

Twenty-seventh Day of June, 1995

Attest:

BRUCE LEHMAN

*Attesting Officer*   *Commissioner of Patents and Trademarks*